US008698266B2

(12) United States Patent
Lee et al.

(10) Patent No.: US 8,698,266 B2
(45) Date of Patent: *Apr. 15, 2014

(54) IMAGE SENSOR WITH DECREASED OPTICAL INTERFERENCE BETWEEN ADJACENT PIXELS

(75) Inventors: Won-Ho Lee, Chungeheongbuk-do (KR); Dong-Heon Cho, Chungeheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/240,115

(22) Filed: Sep. 22, 2011

(65) Prior Publication Data

US 2012/0068294 A1   Mar. 22, 2012

Related U.S. Application Data

(63) Continuation of application No. 12/544,547, filed on Aug. 20, 2009, now Pat. No. 8,030,723, which is a continuation of application No. 11/518,154, filed on Sep. 11, 2006, now Pat. No. 7,598,581.

(30) Foreign Application Priority Data

Sep. 12, 2005   (KR) .............................. 2005-0084564
Sep. 12, 2005   (KR) .............................. 2005-0084565

(51) Int. Cl.
 *H01L 27/146* (2006.01)
(52) U.S. Cl.
 USPC .................................. 257/435; 257/E31.122
(58) Field of Classification Search
 USPC ........................................................ 257/435
 See application file for complete search history.

(56) References Cited

U.S. PATENT DOCUMENTS

| 6,140,670 | A | 10/2000 | Chang |
| 6,207,984 | B1 | 3/2001 | Chang |
| 6,376,872 | B1 | 4/2002 | Pai et al. |
| 6,815,787 | B1 * | 11/2004 | Yaung et al. .................. 257/443 |

(Continued)

FOREIGN PATENT DOCUMENTS

| CN | 1477715 | 2/2004 |
| CN | 1497953 | 5/2004 |

(Continued)

OTHER PUBLICATIONS

Office Action Issued by the Korean Intellectual Property Office on Oct. 19, 2006; 10-2005-0084564.

(Continued)

*Primary Examiner* — David Zarneke
(74) *Attorney, Agent, or Firm* — McAndrews, Held & Malloy, Ltd.

(57) ABSTRACT

An image sensor with decreased optical interference between adjacent pixels is provided. An image sensor, which is divided into a pixel region and a peripheral region, the image sensor including a photodiode formed in a substrate in the pixel region, first to Mth metal lines formed over the substrate in the pixel region, where M is a natural number greater than approximately 1, first to Nth metal lines formed over a substrate in the peripheral region, where N is a natural number greater than M, at least one layer of dummy metal lines formed over the Mth metal lines but formed not to overlap with the photodiode, and a microlens formed over the one layer of the dummy metal lines to overlap with the photodiode.

59 Claims, 10 Drawing Sheets

(56) References Cited

U.S. PATENT DOCUMENTS

| | | | |
|---|---|---|---|
| 7,342,268 B2 | 3/2008 | Adkisson et al. | |
| 7,453,109 B2 | 11/2008 | Koizumi et al. | |
| 7,598,581 B2* | 10/2009 | Lee et al. | 257/435 |
| 7,679,662 B2* | 3/2010 | Suizu et al. | 348/294 |
| 7,923,727 B2* | 4/2011 | Misawa | 257/59 |
| 8,030,723 B2* | 10/2011 | Lee et al. | 257/435 |
| 2004/0130757 A1 | 7/2004 | Mabuchi | |
| 2007/0164389 A1 | 7/2007 | Lee | |
| 2008/0111296 A1 | 5/2008 | Takahashi | |
| 2008/0142919 A1 | 6/2008 | Shin | |
| 2012/0223412 A1* | 9/2012 | Baars et al. | 257/532 |

FOREIGN PATENT DOCUMENTS

| | | |
|---|---|---|
| CN | 1518119 | 8/2004 |
| CN | 1661806 | 8/2005 |
| JP | 10-229182 | 8/1998 |
| JP | 2001298175 | 10/2001 |
| JP | 2003282850 | 3/2003 |
| JP | 2004-071790 | 3/2004 |
| JP | 2004-104203 | 4/2004 |
| JP | 2004-158686 | 6/2004 |
| JP | 2005217439 | 8/2005 |
| JP | 2006-173634 | 6/2006 |

OTHER PUBLICATIONS

Office Action Issued by the Chinese Patent Office on Apr. 25, 2008; 200610127557.7.

Office Action Issued by the Korean Intellectual Property Office on Apr. 9, 2007; 10-2005-0084565.

* cited by examiner

IMAGE SENSOR WITH DECREASED OPTICAL INTERFERENCE BETWEEN ADJACENT PIXELS

CROSS REFERENCE TO RELATED APPLICATIONS

This application is a continuation of U.S. patent application Ser. No. 11/518,154, filed on Sep. 11, 2006, entitled "IMAGE SENSOR WITH DECREASED OPTICAL INTERFERENCE BETWEEN ADJACENT PIXELS", which claims priority to Korean Patent Application No. 2005-0084564, filed on Dec. 9, 2005 and Korean Patent Application No. 2005-0084565, filed on Dec. 9, 2005, the entireties of which are incorporated herein by reference.

FIELD OF THE INVENTION

The present invention relates to an image sensor, and more particularly, to an image sensor improved in photosensitivity by reducing optical interference between adjacent pixels.

DESCRIPTION OF RELATED ARTS

Complementary metal-oxide semiconductor (CMOS) devices have been widely implemented into various devices such as cellular phones, cameras for personal computers, and electronic devices. Compared with charge coupled devices (CCDs) which have been used as typical image sensors, CMOS image sensors can be driven easily and allows a system-on-a-chip (SoC) in which numerous signal processing circuits are integrated in one chip. Due to the SoC, modules of the CMOS image sensors can be minimized. Also, CMOS devices can be implemented employing the typically known methods, and thus, manufacturing costs can be reduced.

FIG. 1 illustrates a simplified top view of an image sensor where four unit pixels are arrayed. Four unit pixels UP, each having a photodiode PD at the center, are arrayed in a 2×2 arrangement.

FIG. 2 illustrates a cross-sectional view of a conventional CMOS image sensor arranged to show pixel and peripheral regions.

A field oxide (FOX) structure is formed in a substrate SUB where a highly doped P++-type region (not shown) and a P-type epitaxial layer (not shown) have already been formed. Although not illustrated, multiple gates including transfer gates are formed over the substrate SUB. For instance, an N-type region (not shown) is formed in a deep bottom region of the substrate SUB aligned to one side of the transfer gate using an ion implantation process. A P-type region (not shown) is formed in a region contacting with the surface of the substrate SUB. The N-type region and the P-type region compose a photodiode PD. Although not illustrated, highly doped N+-type impurities are ion implanted to form a floating diffusion region in a region beneath the substrate SUB aligned to the other side of the transfer gate. Reference letter X represents the pixel region where unit pixels are formed. Reference letter Y represents the peripheral region where peripheral logic circuits are formed.

A pre-metal dielectric layer PMD is formed on the above resultant structure including the photodiode PD and the transistor TR, and fist metal lines M1 are formed on the pre-metal dielectric layer PMD. A first inter-metal dielectric layer IMD1, second metal lines M2, a second inter-metal dielectric layer IMD2, third metal lines M3, a third inter-metal dielectric layer IMD3, and a fourth metal line M4 are formed sequentially on the first metal lines M1. The first and second metal lines M1 and M2 are employed to connect the unit pixel and the logic circuits with a power line or a signal line. Also, the first and second metal lines M1 and M2 shield light from impinging into regions except for the photodiode PD. Although FIG. 2 illustrates the four interposed metal lines M1 to M4, more than four interposed metal lines (e.g., fifth or sixth metal lines) can still be implemented.

A passivation layer PL is formed on the fourth metal line M4 to protect a bottom structure. A first over coating layer OCL1 and a color filter array CFA are formed sequentially on the passivation layer PL. The first over coating layer OCL1 is to secure a process margin when forming the color filter array CFA. The color filter array CFA is necessary to represent red, green and blue (RGB) colors for each unit pixel. Although three primary colors, i.e., RGB, are used, other complementary colors to the three primary colors including yellow Y, magenta Mg and cyan Cy can still be used. The passivation layer PL is usually formed in a dual structure of nitride/oxide.

A second over coating layer OCL2 is formed on the color filter array CFA to secure a process margin when forming a microlens ML on the second over coating layer OCL2. Another passivation layer PSL is formed on the microlens ML to protect the microlens ML from scratches or damage. The microlens ML focus rays of incident light into the photodiode PD, which integrates the focused rays of the incident light.

The pixel region X includes only the first and second metal lines M1 and M2, while the peripheral region Y includes only the third and fourth metal lines M3 and M4. Thus, as compared with those rays of incident light passing through the microlens ML as reference letter A illustrates, those rays of light passing through the microlenses of the adjacent unit pixels as reference letter B illustrates are also integrated into the photodiode PD. This unintended integration of the incident light from the adjacent unit pixels causes optical interference. The optical interference may result in degradation of image characteristics such as induction of lattice patterns or color distortion.

SUMMARY OF THE INVENTION

It is, therefore, an object of the present invention to provide an image sensor that can reduce degradation of image characteristics, usually caused by optical interference between adjacent pixels.

In accordance with an aspect of the present invention, there is provided an image sensor, which is divided into a pixel region and a peripheral region, the image sensor including a photodiode formed in a substrate in the pixel region, first to Mth metal lines formed over the substrate in the pixel region, where M is a natural number greater than approximately 1, first to Nth metal lines formed over a substrate in the peripheral region, where N is a natural number greater than M, at least one layer of dummy metal lines formed over the Mth metal lines but formed not to overlap with the photodiode, and a microlens formed over the one layer of the dummy metal lines to overlap with the photodiode.

In accordance with another aspect of the present invention, there is provided an image sensor, which is divided into a pixel region and a peripheral region, the image sensor including a photodiode formed in a substrate in the pixel region, first to Mth metal lines formed over the substrate in the pixel region, where M is a natural number greater than approximately 1, first to Nth metal lines formed over a substrate in the peripheral region, where N is a natural number greater than M, at least one layer of dummy metal lines formed over the Mth metal lines to cover a portion that is not overlapped with the photodiode, and a microlens formed over the one layer of the dummy metal lines to overlap with the photodiode.

In accordance with still another aspect of the present invention, there is provided an image sensor, which is divided into a pixel region and a peripheral region, the image sensor including a photodiode formed in a substrate in the pixel region, first to Mth metal lines formed over the substrate in the pixel region, where M is a natural number greater than approximately 1, first to Nth metal lines formed over a substrate in the peripheral region, where N is a natural number greater than M, at least one layer of dummy metal lines formed over the Mth metal lines by having an insulation layer between the dummy metal lines and the Mth metal lines but formed not to overlap with the photodiode, and a microlens formed over the one layer of dummy metal lines to overlap with the photodiode.

In accordance with still another aspect of the present invention, there is provided an image sensor, which is divided into a pixel region and a peripheral region, the image sensor including a photodiode formed in a substrate in the pixel region, first to Mth metal lines formed over the substrate in the pixel region, where M is a natural number greater than approximately 1, first to Nth metal lines formed over a substrate in the peripheral region, where N is a natural number greater than M, at least one layer of dummy metal lines formed in contact with the Mth metal lines but not to overlap with the photodiode, the dummy metal line used as a via contact and including a metal, and a microlens formed over the one layer of the dummy metal lines to overlap with the photodiode.

In accordance with a further aspect of the present invention, there is provided an image sensor, which is divided into a pixel region and a peripheral region, the image sensor including a photodiode formed in a substrate in the pixel region, first to Mth metal lines formed over the substrate in the pixel region, where M is a natural number greater than approximately 1, first to Nth metal lines formed over a substrate in the peripheral region, where N is a natural number greater than M, at least one layer of first dummy metal lines formed over the Mth metal lines not to overlap with the photodiode, at least one layer of second dummy metal lines formed to contact with the one layer of the first dummy metal line, and a microlens formed over the one layer of the second dummy metal lines to overlap with the photodiode.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

An image sensor with decreased optical interference between adjacent pixels in accordance with exemplary embodiments of the present invention will be described in detail with reference to the accompanying drawings.

Figure 3:
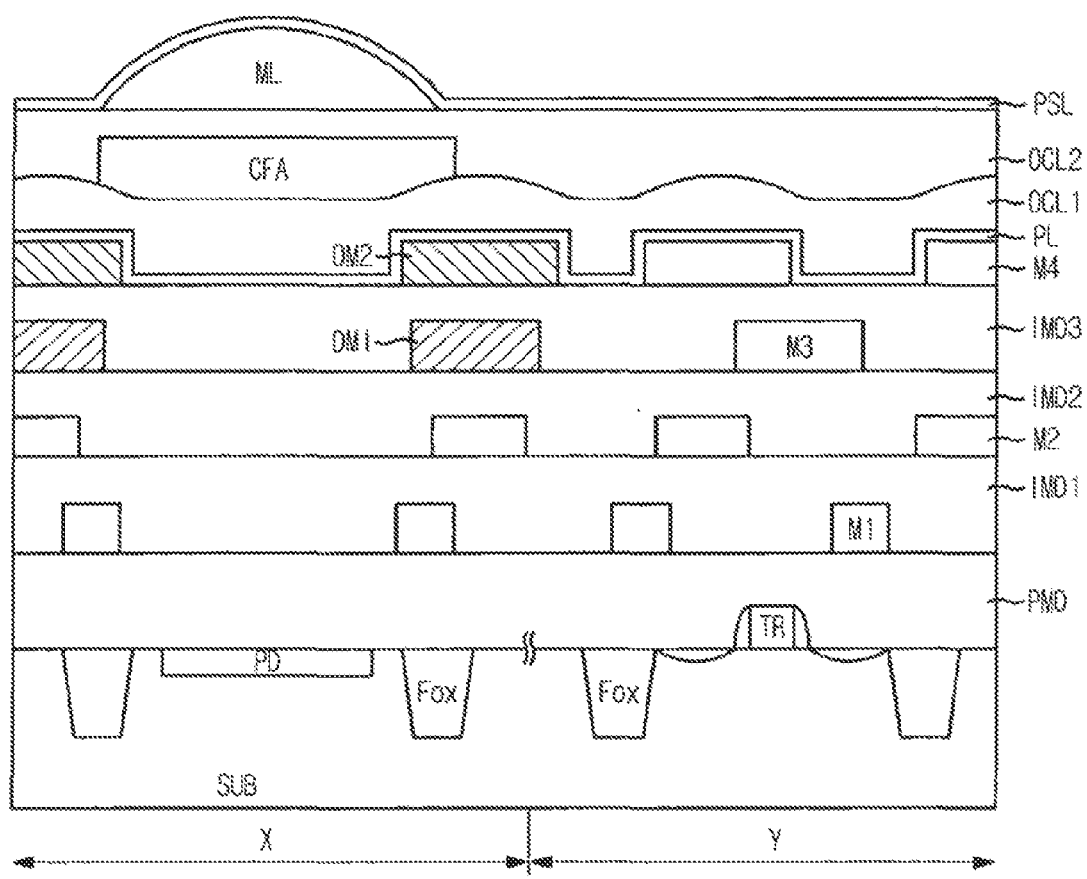
FIG. 3 illustrates a cross-sectional view of a CMOS image sensor to show a pixel region and a peripheral region in accordance with a first embodiment of the present invention.

FIG. 3 illustrates a cross-sectional view of a CMOS image sensor arranged to show a pixel region and a peripheral region in accordance with a first embodiment of the present invention.

A field oxide (FOX) structure is formed in a substrate SUB where a highly doped P++-type region (not shown) and a P-type epitaxial layer (not shown) have already been formed. Although not illustrated, multiple gates including transfer gates are formed over the substrate SUB. For instance, an N-type region (not shown) is formed in a deep bottom region of the substrate SUB aligned to one side of the transfer gate using an ion implantation process. A P-type region (not shown) is formed in a region contacting with the surface of the substrate SUB. The N-type region and the P-type region compose a photodiode PD. Although not illustrated, highly doped N+-type impurities are ion implanted to form a floating diffusion region in a region beneath the substrate SUB aligned to the other side of the transfer gate. Reference letter X represents the pixel region where unit pixels are formed. Reference letter Y represents the peripheral region where peripheral logic circuits are formed.

Figure 1:
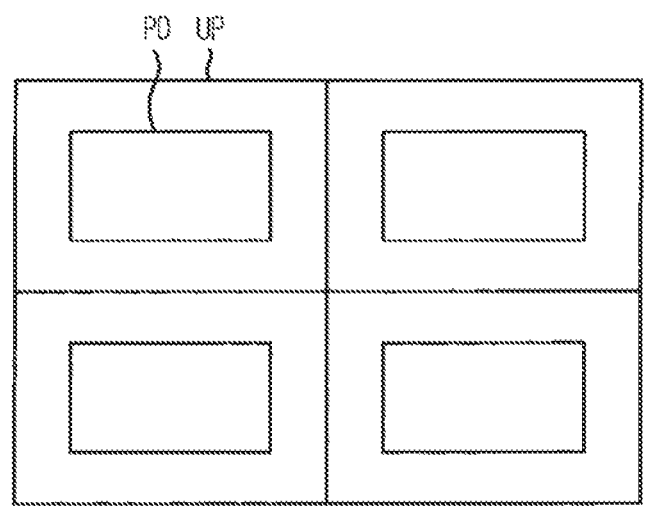
FIG. 1 illustrates a simplified top view of a conventional image sensor in which four unit pixels are arranged.
Figure 2:
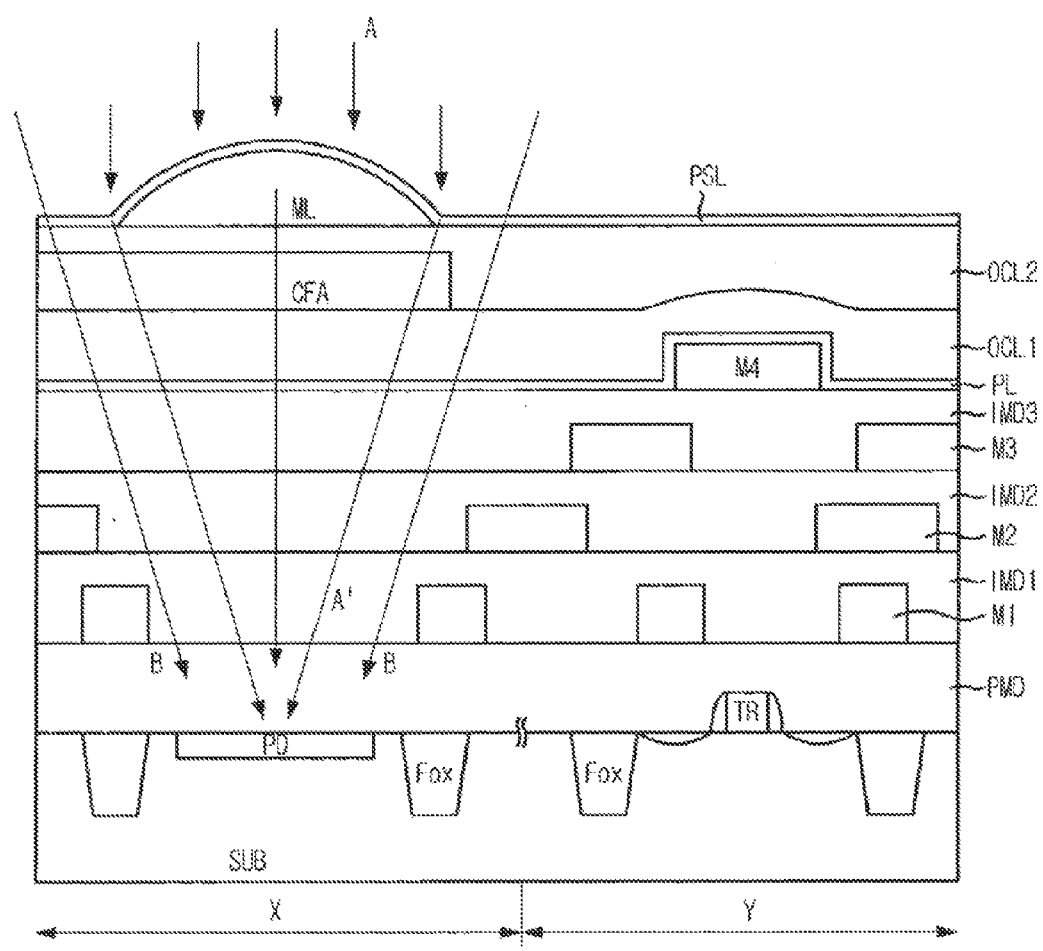
FIG. 2 illustrates a cross-sectional view of a conventional CMOS image sensor arranged to show a pixel region and a peripheral region.

A pre-metal dielectric layer PMD is formed on the above resultant structure including the photodiode PD and the transistor TR, and fist metal lines M1 are formed on the pre-metal dielectric layer PMD. A first inter-metal dielectric layer IMD1, second metal lines M2, a second inter-metal dielectric layer IMD2, third metal lines M3, a third inter-metal dielectric layer IMD3, and a fourth metal line M4 are formed sequentially on the first metal lines M1. The first and second metal lines M1 and M2 are employed to connect the unit pixel and the logic circuits with a power line or a signal line. Also, the first and second metal lines M1 and M2 shield light from impinging into regions except for the photodiode PD. Although FIG. 2 illustrates the four interposed metal lines M1 to M4, more than four interposed metal lines (e.g., fifth or sixth metal lines) can still be implemented.

A passivation layer PL is formed on the fourth metal line M4 to protect a bottom structure. A first over coating layer OCL1 and a color filter array CFA are formed sequentially on the passivation layer PL. The first over coating layer OCL1 is to secure a process margin when forming the color filter array CFA. The color filter array CFA is necessary to represent red, green and blue (RGB) colors for each unit pixel. Although three primary colors, i.e., RGB, are used, other complementary colors to the three primary colors including yellow Y, magenta Mg and cyan Cy can still be used. The passivation layer PL is usually formed in a dual structure of nitride/oxide.

A second over coating layer OCL2 is formed on the color filter array CFA to secure a process margin when forming microlens ML on the second over coating layer OCL2. Another passivation layer PSL is formed on the microlens ML to protect the microlens ML from scratches or damage.

The microlens ML focus rays of incident light into the photodiode PD, which integrates the focused rays of the incident light.

In the typical image sensor, the pixel region X includes only the first metal lines M1 and the second metal lines M2, while the peripheral region Y includes only the third metal lines M3 and the fourth metal lines M4. However, according to the present embodiment, as illustrated in FIG. 3, two layers of dummy metal lines DM1 and DM2 are formed also in the pixel region X without blocking a region where the photodiode PD is formed. The two layers of the dummy metal lines DM1 and DM2 shield incident light from adjacent pixels.

Although forming the two layers of the dummy metal lines DM1 and DM2 on respective regions where the third and fourth metal lines are formed is exemplified in the present embodiment, one layer of dummy metal lines can still be formed. Also, the two layers of the dummy metal lines DM1 and DM2 can be formed as simultaneously as the third and fourth metal lines M3 and M4 are formed, or separately from the formation of the third and fourth metal lines M3 and M4.

Figure 4:
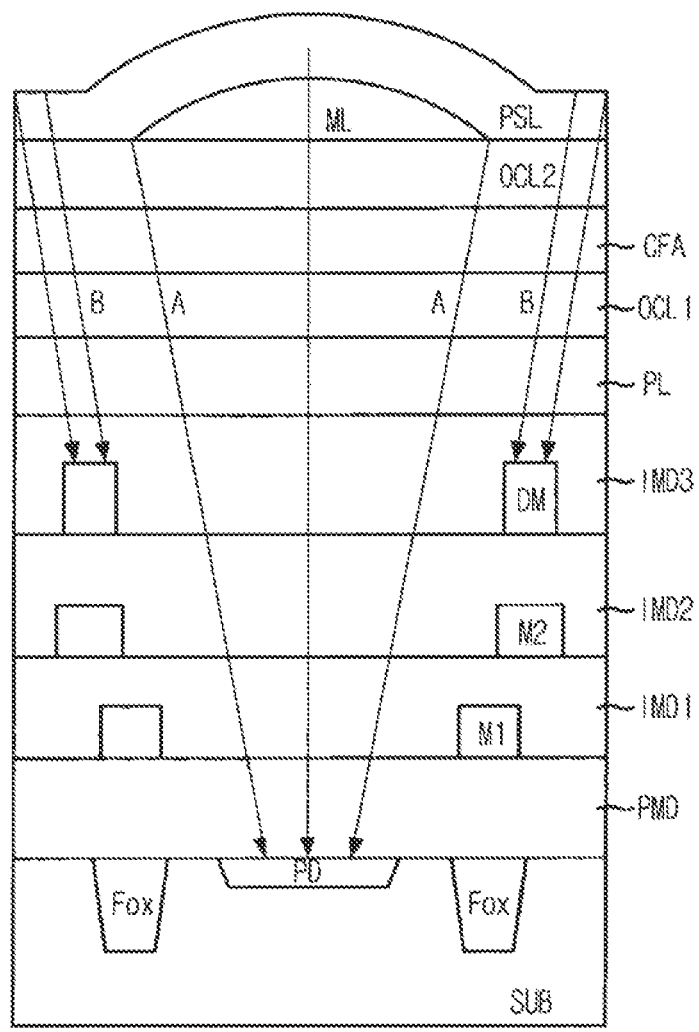
FIG. 4 illustrates a cross-sectional view of an image sensor with a structure that at least one layer of dummy metal lines is implemented in every pixel region in accordance with an embodiment of the present invention.

FIG. 4 illustrates a cross-sectional view of an image sensor with a structure that at least one layer of dummy metal lines is implemented in every pixel region in accordance with an embodiment of the present invention. Like reference numerals denote like elements described in FIG. 3, and thus, detailed description thereof will be omitted.

As reference letter A shows, rays of incident light passing through a microlens ML are integrated into a photodiode PD. In contrast, as reference letter B shows, the dummy metal lines DM block rays of incident light from adjacent pixels from impinging into the photodiode PD.

Figure 5:
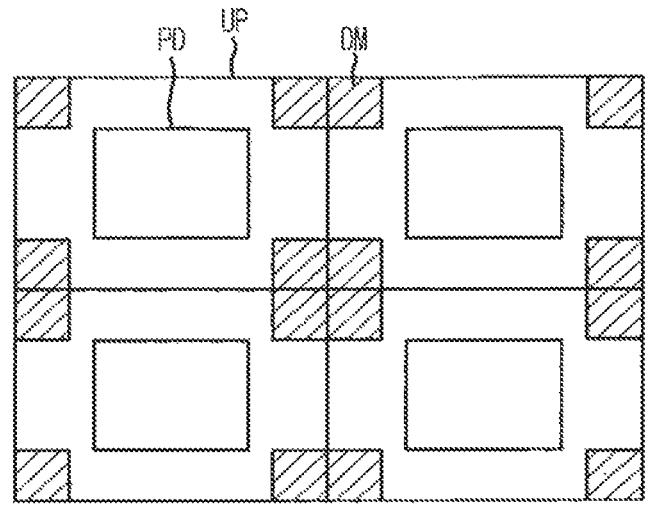
FIGS. 5 to 10 illustrate top views of various exemplary dummy metal line shapes and structures.

The dummy metal lines can be formed in various forms and structures. FIGS. 5 to 10 illustrate top views of dummy metal lines formed in various forms and structures. FIG. 5 illustrates a top view of dummy metal lines formed in a square shape and a symmetrical structure. Each unit pixel UP includes a photodiode PD in a central portion, and square-shaped dummy metal lines DM are placed such that a central point of each of the dummy metal lines DM is positioned at a point where four corners of the adjacent unit pixels UP commonly meet.

Figure 6:
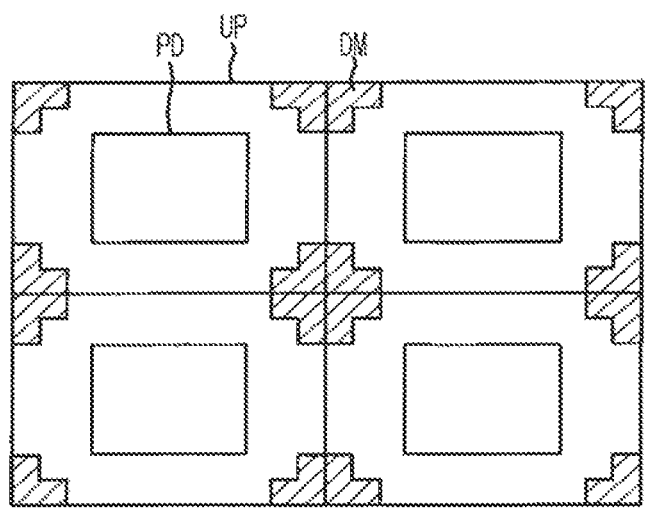

FIG. 6 illustrates a top view of dummy metal lines formed in a cross shape and a symmetrical structure. Each unit pixel UP includes a photodiode PD in a central portion, and cross-shaped dummy metal lines DM are placed such that a central point of each of the dummy metal lines DM is positioned at a point where four corners of the adjacent unit pixels UP commonly meet.

Figure 7:
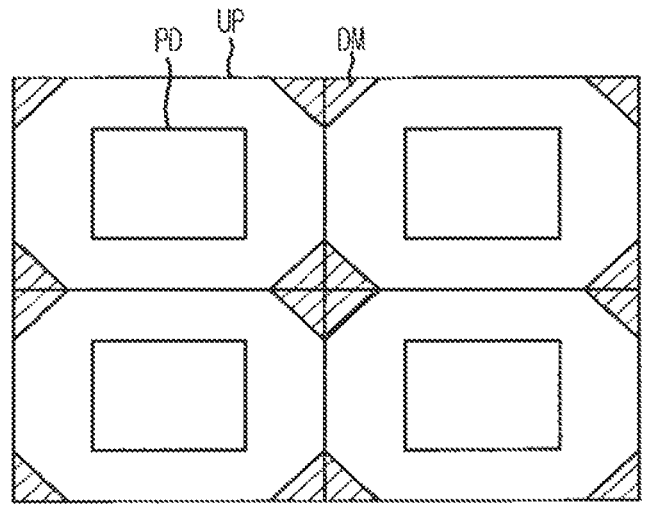

FIG. 7 illustrates a top view of dummy metal lines formed in a rhombus shape and a symmetrical structure. Each unit pixel UP includes a photodiode PD in a central portion, and rhombus-shaped dummy metal lines DM are placed such that a central point of each of the dummy metal lines DM is positioned at a point where four corners of the adjacent unit pixels UP commonly meet.

Figure 8:
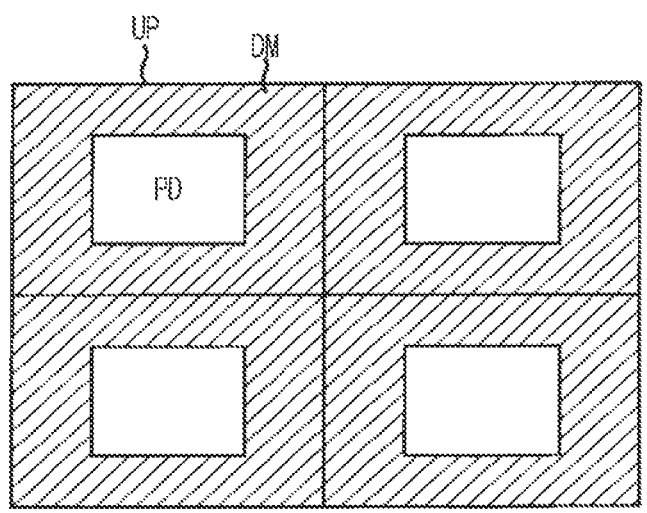

FIG. 8 illustrates a top view of dummy metal lines formed in a symmetrical structure to cover all regions of unit pixels except for photodiode regions. Each unit pixel UP includes a photodiode PD in a central portion, and dummy metal lines DM are placed in the entire region of the unit pixels UP except for the photodiode regions PD.

Figure 9:
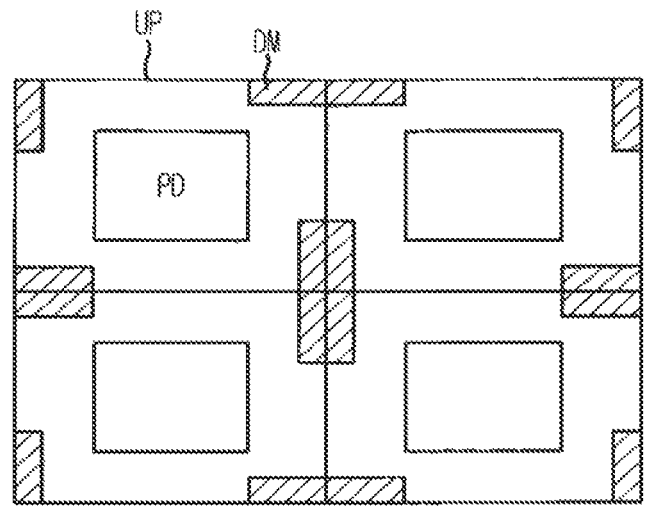

FIG. 9 illustrates a top view of dummy metal lines formed in a rectangular shape and a non-symmetrical structure. Each unit pixel UP includes a photodiode PD in a central portion, and rectangular dummy metal lines DM are placed in a portion where four corners of the adjacent unit pixels UP commonly meet.

Figure 10:
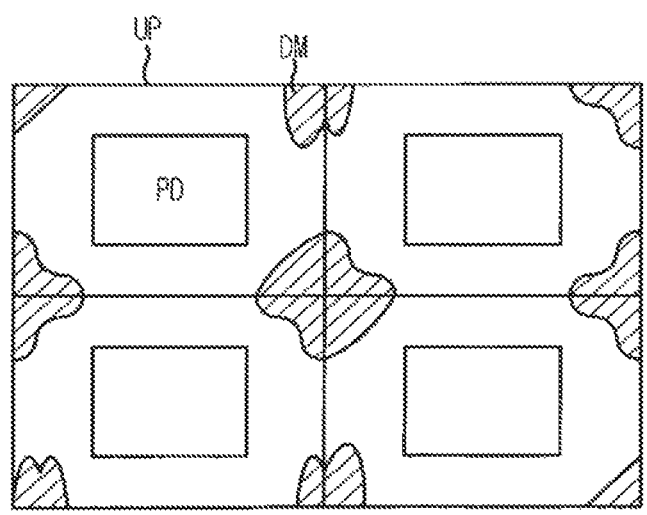

FIG. 10 illustrates a top view of dummy metal lines formed in a specific shape and a non-symmetrical structure. Each unit pixel UP includes a photodiode PD in a central portion, and dummy metal lines DM that are formed in a specific shape are placed in a portion where four corners of the adjacent unit pixels UP commonly meet.

Although FIGS. 5 to 10 illustrate the formation of the dummy metal lines in one shape and structure in one pixel region, the dummy metal lines can still be formed in various shapes and structures in one pixel region. As described above, at least one dummy metal line that corresponds to the metal line formed in the peripheral region is formed in the pixel region, and the dummy metal line can reduce the optical interference and allows increasing a process margin for a subsequent metal line etching process.

Figure 11:
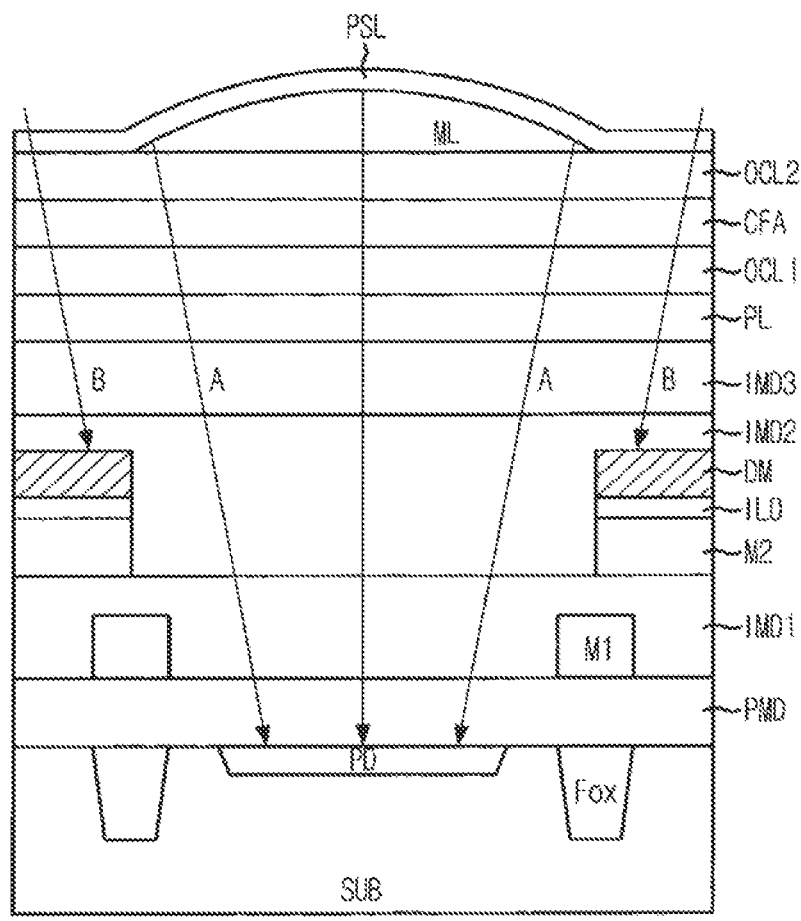
FIG. 11 illustrates a unit pixel of the CMOS image sensor in accordance with the first embodiment of the present invention.

FIG. 11 illustrates a cross-sectional view of a unit pixel of the CMOS image sensor in accordance with the first embodiment of the present invention.

A field oxide (FOX) structure is formed in a substrate SUB where a highly doped P++-type region (not shown) and a P-type epitaxial layer (not shown) have already been formed. Although not illustrated, multiple gates including transfer gates are formed over the substrate SUB. For instance, an N-type region (not shown) is formed in a deep bottom region of the substrate SUB aligned to one side of the transfer gate using an ion implantation process. A P-type region (not shown) is formed in a region contacting with the surface of the substrate SUB. The N-type region and the P-type region compose a photodiode PD. Although not illustrated, highly doped N+-type impurities are ion implanted to form a floating diffusion region in a region beneath the substrate SUB aligned to the other side of the transfer gate.

A pre-metal dielectric layer PMD is formed over the above resulting structure including the photodiode PD and the multiple transistors, and first metal lines M1 are formed over the pre-metal dielectric layer PMD. A first inter-metal dielectric layer IMD1 is formed over the first metal lines M1. Second metal lines M2 and a second inter-metal dielectric layer IMD2 are sequentially formed over the first inter-metal dielectric layer IMD1. Although not illustrated, third metal lines M3 are formed over the second inter-metal dielectric layer IMD2 in the peripheral region. A third inter-metal dielectric layer IMD3 is formed over the third metal lines (not shown). Although not illustrated, fourth metal lines are formed over the third inter-metal dielectric layer IMD3 in the peripheral region.

The first and second metal lines M1 and M2 connect a power line or a signal line with the unit pixel and with the logic circuits in the peripheral region, and shield light from impinging into regions other than the photodiode PD. Although the present embodiment shows the implementation of the four interposed metal lines, more than four interposed metal lines (e.g., a fifth or sixth metal line) can still be implemented.

A passivation layer PL is formed over the fourth metal line (not shown) to protect a bottom structure beneath the fourth metal line (not shown). A first over coating layer OCL1 is formed over the passivation layer PL to obtain a desired process margin during a subsequent color filter array process. Over the first over coating layer OCL1, a color filter array CFA is formed to represent RGB colors for each unit pixel. Although RGB colors, which are three primary colors, are typically used, complementary colors to the RGB colors including yellow, magenta and cyan may be used. The passivation layer PL is formed in a dual structure of nitride/oxide.

A second over coating layer OCL2 is formed over the color filter array CFA to secure a desired process margin for a subsequent microlens process. A microlens ML is formed over the second over coating layer OCL2. Another passivation layer PSL is formed over the microlens ML to protect the microlens ML from scratches or damage. The microlens ML focuses rays of incident light onto the photodiode PD.

The first and second metal lines M1 and M2 are formed in the pixel array region, and those metal lines formed above the first and second metal lines, e.g., the third and fourth metal lines (not shown), are formed in the peripheral region. As illustrated in FIG. 11, one layer of dummy metal lines DM are formed to contact to the respective second metal lines M2 by having inter-layer dielectric layers ILD individually therebetween. The dummy metal lines DM are also arranged not to overlap with the photodiode PD. As a result, the dummy metal lines DM can shield incident light from adjacent pixels from impinging into the photodiode PD.

The dummy metal lines DM and the inter-layer dielectric layers ILD can be formed in the pixel region as simultaneously as a capacitor including a stack structure of the second metal line M2, the inter-layer dielectric layer ILD and the dummy metal line DM is formed in the peripheral region. The stack structure of the second metal line M2, the inter-layer dielectric layer ILD and the dummy metal line DM is used as the capacitor in the peripheral region. However, the inter-layer dielectric layers ILD in the pixel region are used to insulate the second metal lines M2 and the dummy metal lines DM from each other.

As illustrated in FIG. 11, reference letter A denotes rays of incident light passing through the microlens ML and focused onto the photodiode PD. In contrast, reference letter B denotes rays of incident light from adjacent pixels. The dummy metal lines DM block the rays of the incident light from entering into the photodiode PD.

The dummy metal lines DM can be arranged in various types. The dummy metal lines DM may include titanium nitride (TiN), and the inter-layer dielectric layers ILD may include an oxide-based material. Each of the dummy metal lines may be formed to a thickness of approximately 1,500 Å, and each of the inter-layer dielectric layers ILD may be formed to a thickness of 600 Å, so that a total thickness of the above stack (i.e., the dummy metal line DM and the inter-layer dielectric layer ILD) becomes approximately 2,100 Å.

Figure 12:
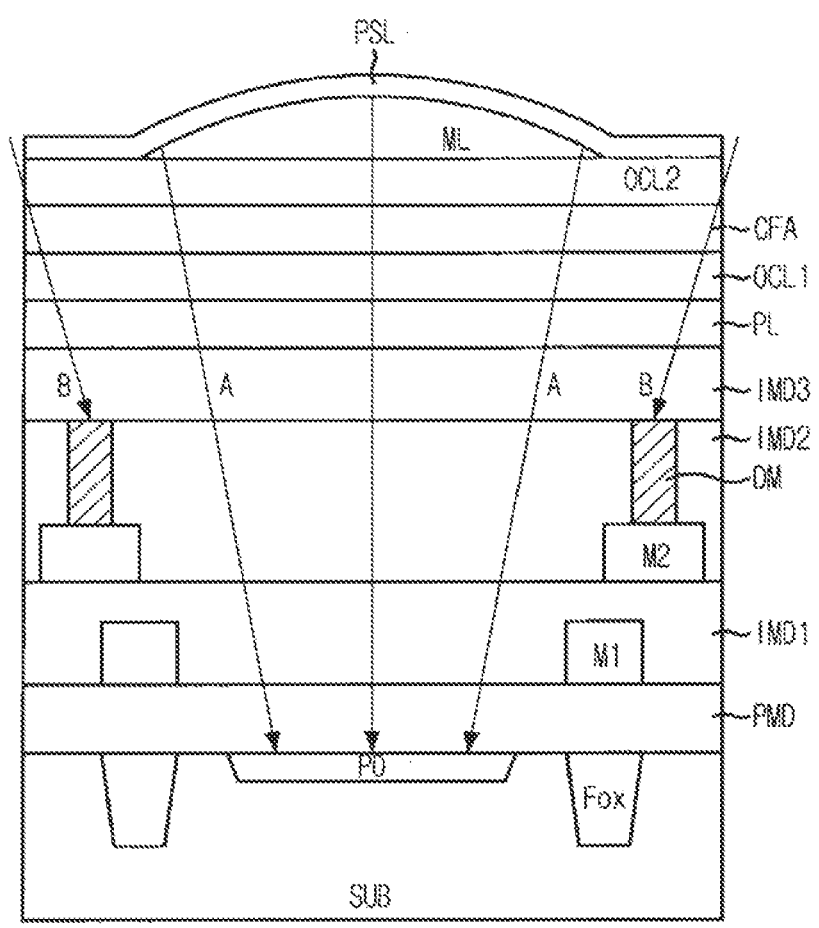
FIG. 12 illustrates a unit pixel of a CMOS image sensor in accordance with a second embodiment of the present invention.

FIG. 12 illustrates a cross-sectional view of a unit pixel of a CMOS image sensor in accordance with a second embodiment of the present invention. Like reference numerals denote like elements described in FIG. 11, and detailed description thereof will be omitted.

One layer of dummy metal lines DM is formed not to overlap with a photodiode PD in a pixel region but directly in contact with respective second metal lines M2. The dummy metal lines DM shield incident lights from adjacent pixels from impinging onto the photodiode PD.

The dummy metal lines DM correspond to via contacts that connect the second metal lines M2 with respective third metal lines M3 in a peripheral region. The dummy metal lines DM may be formed in the pixel region as simultaneously as the via contacts are formed in the peripheral region. That is, the via contacts in the peripheral region are used as the originally intended purpose, while the via contacts in the pixel region shield incident light from adjacent pixels from impinging onto the photodiode PD by making the second metal lines M2 extend upwardly without contacting to the third metal lines. Also, the dummy metal lines DM (i.e., the via contacts) are formed to a thickness of approximately 6,000 Å.

As reference letter A illustrates in FIG. 12, rays of incident light passing through a microlens ML are focused onto the photodiode PD. In contrast, as reference letter B illustrates, rays of incident light from the adjacent pixels are shielded by the dummy metal lines DM.

Figure 13:
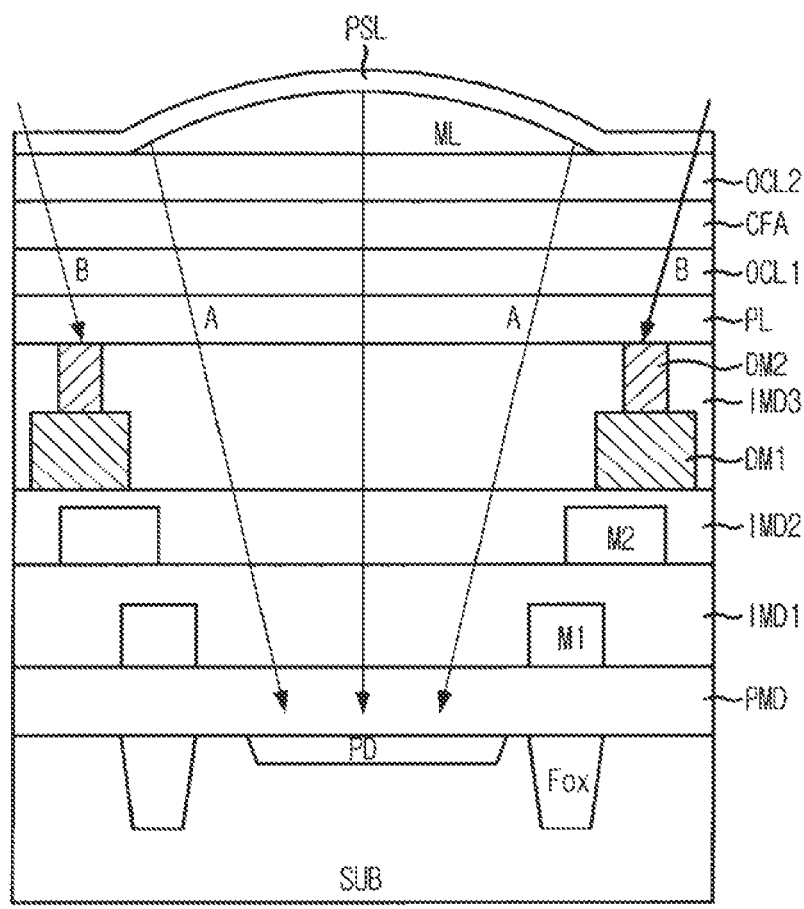
FIG. 13 illustrates a unit pixel of a CMOS image sensor in accordance with a third embodiment of the present invention.

FIG. 13 illustrates a cross-sectional view of a unit pixel of a CMOS image sensor in accordance with a third embodiment of the present invention. Like reference numerals denote like elements described in FIGS. 11 and 12, and detailed description thereof will be omitted.

In a pixel region, first and second dummy metal lines DM1 and DM2 are formed in two layers over the second metal lines M2 but not to overlap with a photodiode PD. The first and second dummy metal lines DM1 and DM2 shield incident light from adjacent pixels from impinging onto the photodiode PD.

The first dummy metal lines DM1 correspond to third metal lines in a peripheral region, and the second dummy metal lines DM2 correspond to via contacts connecting the third metal lines with respective fourth metal lines in the peripheral region. The first and second metal lines DM1 and DM2 may be formed in the pixel region as simultaneously as the third metal lines and the via contacts are formed in the peripheral region.

The third metal lines and the via contacts in the peripheral region are used as the originally intended purpose. In contrast, the first and second dummy metal lines DM1 and DM2 in the pixel region can shield incident light from the adjacent pixels from impinging onto the photodiode PD by being formed over the second metal lines M2 without contacting to the second metal lines M2 and the fourth metal lines.

As reference letter A illustrates in FIG. 13, rays of incident light passing through a microlens ML are focused onto the photodiode PD. On the other hand, as reference letter B illustrates in FIG. 13, rays of incident light from the adjacent pixels are shielded by the first and second dummy metal lines DM1 and DM2.

The above illustrated dummy metal lines in FIGS. 11 to 13 are only exemplary. In addition to these three different types, the dummy metal lines may be formed in various structures constructed in combination of these three types. For instance, capacitor type dummy metal lines and dummy metal lines corresponding to the third metal lines are formed over the second metal lines. At this time, dummy metal lines corresponding to via contacts are formed in addition to the dummy metal lines corresponding to the third metal lines.

According to various embodiments of the present invention, at least one dummy metal line corresponding to a metal line, a via contact, and a capacitor formed in a peripheral region is formed in a pixel region. As a result, optical interference can be reduced due to the dummy metal line. The reduced optical interference disallows the degradation of image characteristics, and thus, yield of image sensors can increase.

Although forming at least one dummy metal line in a CMOS image sensor is exemplified in the above embodiments, the dummy metal line can still be formed in any image sensor that includes a photo-integration unit and a microlens.

The present application contains subject matter related to the Korean patent application Nos. KR 2005-0084564 and KR 2005-0084565, filed in the Korean Patent Office on Sep. 12, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An image sensor comprising:
a plurality of pixels, each including:
a photodiode; and
a dummy metal line;
wherein:
the dummy metal lines in adjacent pixels of the plurality of pixels combine to form a light shield; and
the dummy metal lines only partially cover areas surrounding each of the photodiodes.

2. The image sensor of claim 1, wherein each dummy metal line is positioned in a corner area of its corresponding pixel.

3. The image sensor of claim 1, wherein the plurality of pixels includes four pixels.

4. The image sensor of claim 1, wherein the light shield forms an amorphous shape.

5. The image sensor of claim 4, wherein the light shield is symmetric about its diagonal axis and symmetric about at least one of its horizontal axis or its vertical axis.

6. The image sensor of claim 4, wherein the light shield is symmetric about its diagonal axis and asymmetric about at least one of its horizontal axis or its vertical axis.

7. The image sensor of claim 4, wherein the light shield is asymmetric about its diagonal axis and symmetric about at least one of its horizontal axis or its vertical axis.

8. The image sensor of claim 4, wherein the light shield is asymmetric about its diagonal axis and asymmetric about at least one of its horizontal axis or its vertical axis.

9. The image sensor of claim 4, wherein the light shield includes a dummy metal line having an amorphous shape and a dummy metal line having a geometric shape.

10. The image sensor of claim 4, wherein the light shield includes an amorphous portion and a geometric portion.

11. The image sensor of claim 1, wherein the light shield forms a geometric shape.

12. The image sensor of claim 11, wherein the light shield forms at least one of a square, a rectangle, a cross, a rhombus, or a shape including at least one curve.

13. The image sensor of claim 12, wherein the light shield forms a square.

14. The image sensor of claim 12, wherein the light shield forms a rectangle.

15. The image sensor of claim 12, wherein the light shield forms a cross.

16. The image sensor of claim 12, wherein the light shield forms a rhombus.

17. The image sensor of claim 12, wherein the light shield forms a shape including at least one curve.

18. The image sensor of claim 11, wherein the light shield is symmetric about its diagonal axis and symmetric about at least one of its horizontal axis or its vertical axis.

19. The image sensor of claim 11, wherein the light shield is symmetric about its diagonal axis and asymmetric about at least one of its horizontal axis or its vertical axis.

20. The image sensor of claim 11, wherein the light shield is asymmetric about its diagonal axis and symmetric about at least one of its horizontal axis or its vertical axis.

21. The image sensor of claim 11, wherein the light shield is asymmetric about its diagonal axis and asymmetric about at least one of its horizontal axis or its vertical axis.

22. The image sensor of claim 1, wherein at least one of the dummy metal lines forms an amorphous shape.

23. The image sensor of claim 1, wherein at least one of dummy metal lines forms a geometric shape.

24. The image sensor of claim 23, wherein at least one of the dummy metal lines forms at least one of a square, a rectangle, an "L" shape, a triangle, or a shape including at least one curve.

25. The image sensor of claim 24, wherein the at least one of the dummy metal lines forms a square.

26. The image sensor of claim 24, wherein the at least one of the dummy metal lines forms a rectangle.

27. The image sensor of claim 24, wherein the at least one of the dummy metal lines forms an "L" shape.

28. The image sensor of claim 24, wherein the at least one of the dummy metal lines forms a triangle.

29. The image sensor of claim 24, wherein the at least one of the dummy metal lines forms a shape including at least one curve.

30. The image sensor of claim 1, wherein at least one of the pixels includes a horizontal axis, a vertical axis, a diagonal axis, and a plurality of dummy metal lines.

31. The image sensor of claim 30, wherein the plurality of dummy metal lines in the at least one pixel include different shapes.

32. The image sensor of claim 30, wherein the plurality of dummy metal lines in the at least one pixel include similar shapes.

33. The image sensor of claim 32, wherein the plurality of dummy metal lines in the at least one pixel include different orientations of shapes of the plurality of dummy metal lines.

34. The image sensor of claim 32, wherein the plurality of dummy metal lines in the at least one pixel include similar orientations of shapes of the plurality of dummy metal lines.

35. The image sensor of claim 30, wherein the dummy metal lines of the plurality of dummy metal lines are collectively:
symmetric about at least one of the horizontal axis or the vertical axis; and
symmetric about the diagonal axis.

36. The image sensor of claim 30, wherein the plurality of dummy metal lines of the plurality of dummy metal lines are collectively:
symmetric about at least one of the horizontal axis or the vertical axis; and
asymmetric about the diagonal axis.

37. The image sensor of claim 30, wherein the plurality of dummy metal lines of the plurality of dummy metal lines are collectively:
asymmetric about at least one of the horizontal axis or the vertical axis; and
symmetric about the diagonal axis.

38. The image sensor of claim 30, wherein the plurality of dummy metal lines of the plurality of dummy metal lines are collectively:
asymmetric about at least one of the horizontal axis or the vertical axis; and
asymmetric about the diagonal axis.

39. The image sensor of claim 30, wherein at least one of the dummy metal lines in the at least one pixel is located along at least one side of the at least one pixel.

40. The image sensor of claim 39, wherein at least two of the dummy metal lines in the at least one pixel are located along at least two sides of the at least one pixel.

41. The image sensor of claim 40, wherein the at least two of the dummy metal lines in the at least one pixel have different widths.

42. The image sensor of claim 39, wherein the at least one pixel includes four sides, and wherein the dummy metal lines are located along each of the four sides.

43. The image sensor of claim 30, wherein the at least one of the pixels includes four corner regions.

44. The image sensor of claim 43, wherein a dummy metal line is located in each of the four corner regions.

45. The image sensor of claim 44, wherein the dummy metal lines located in each of the four corner regions have a similar shape and a similar orientation.

46. The image sensor of claim 44, wherein the dummy metal lines located in each of the four corner regions have similar shapes, and wherein at least one of the dummy metal lines located in at least one of the corner regions has a different orientation.

47. The image sensor of claim 44, wherein at least one of the dummy metal lines located in at least one of the corner regions has a different shape.

48. The image sensor of claim 47, wherein each of the dummy metal lines disposed in the four corner regions have different shapes.

49. An image sensor pixel comprising:
- a photodiode in a pixel region of the image sensor pixel;
- a metal line in the pixel region configured to connect the image sensor pixel to at least one of a logic circuit or a power line;
- a dummy metal line in the pixel region and positioned to block a light from outside of the pixel region from impinging on the photodiode;
- a dielectric positioned between the metal line and the dummy metal line;
- wherein the metal line, the dummy metal line, and the dielectric form a capacitor; and
- wherein the dummy metal line only partially covers areas surrounding the photodiode.

50. The image sensor pixel of claim 49, wherein the capacitor forms a circuit with elements in a peripheral region of the image sensor pixel.

51. An image sensor pixel comprising:
- a photodiode in a pixel region of the image sensor pixel;
- a metal line in the pixel region configured to connect the image sensor pixel to at least one of a logic circuit or a power line; and
- a first dummy metal line in the pixel region and positioned to block a light from outside of the pixel region from impinging on the photodiode;
- wherein the first dummy metal line comprises a via contact including a top surface and a bottom surface.

52. The image sensor pixel of claim 51, wherein the bottom surface of the first dummy metal line is adjacent to the metal line.

53. The image sensor pixel of claim 52, wherein the top surface of the first dummy metal line is not adjacent to another dummy metal line or the metal line.

54. The image sensor pixel of claim 52, further comprising a second dummy metal line positioned above the first dummy metal line.

55. The image sensor pixel of claim 54, wherein the second dummy metal line is positioned directly above the first dummy metal line.

56. The image sensor pixel of claim 54, wherein the second dummy metal line comprises a via contact including a bottom surface adjacent to the first dummy metal line.

57. The image sensor pixel of claim 51, further comprising:
- a lower layer including the photodiode, wherein the photodiode is positioned in a center area of the pixel region and not in a right area or a left area of the pixel region;
- a pre-metal dielectric layer positioned above the lower layer and including, in the pixel region, a dielectric;
- a first metal line layer positioned above the pre-metal dielectric layer and including, in the pixel region, a plurality of metal lines and a dielectric; and
- a first dummy metal line layer positioned above the first metal line layer and including, in the pixel region, a plurality of dummy metal lines and a dielectric;
- wherein the plurality of metal lines in the first metal line layer and the plurality of metal lines in the first dummy metal line layer are positioned in the right area or the left area of the pixel region and are not substantially positioned in the center area of the pixel region.

58. The image sensor pixel of claim 57, wherein:
the lower layer includes, in a peripheral region of the image sensor pixel, a portion of a transistor;
the pre-metal dielectric layer includes, in the peripheral region, a portion of the transistor and a dielectric;
the first metal line layer includes, in the peripheral region, a plurality of metal lines and a dielectric; and
the first dummy metal line layer includes, in the peripheral region, a plurality of metal lines and a dielectric.

59. An image sensor pixel comprising:
a peripheral region including:
- a first layer comprising a first peripheral region metal line;
- a second layer positioned above the first layer and comprising a second peripheral region metal line; and
- a via contact connecting the first peripheral region metal line with the second peripheral region metal line; and a pixel region including:
- the first layer comprising a first pixel region metal line;
- the second layer positioned above the first layer; and
- a via contact positioned between the first pixel region metal line and the second layer;

wherein the via contact in the pixel region comprises a dummy metal line positioned to block a light from outside of the pixel region.

* * * * *